US008013515B2

(12) United States Patent
Tanimoto et al.

(10) Patent No.: US 8,013,515 B2
(45) Date of Patent: Sep. 6, 2011

(54) LIGHT-EMITTING MODULE, AND DISPLAY UNIT AND LIGHTING UNIT USING THE SAME

(75) Inventors: Noriyasu Tanimoto, Osaka (JP); Hideo Nagai, Osaka (JP); Yoshirou Tooya, Kagoshima (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/779,461

(22) Filed: May 13, 2010

(65) Prior Publication Data
US 2010/0219745 A1 Sep. 2, 2010

Related U.S. Application Data

(63) Continuation of application No. 11/995,290, filed as application No. PCT/JP2006/322051 on Oct. 27, 2006, now Pat. No. 7,745,985.

(30) Foreign Application Priority Data

Nov. 4, 2005 (JP) .................................. 2005-321146

(51) Int. Cl.
*H01L 33/00* (2010.01)
*H05B 33/00* (2006.01)

(52) U.S. Cl. ........ 313/501; 313/502; 313/506; 313/512; 362/84; 362/800

(58) Field of Classification Search .................. None
See application file for complete search history.

(56) References Cited

U.S. PATENT DOCUMENTS

| 5,994,722 | A | 11/1999 | Averbeck et al. |
| 6,404,125 | B1 | 6/2002 | Garbuzov et al. |
| 7,235,817 | B2 | 6/2007 | Yano et al. |
| 7,282,853 | B2 * | 10/2007 | Yano et al. ................... 313/498 |
| 7,312,560 | B2 | 12/2007 | Ouderkirk et al. |
| 2003/0178627 | A1 | 9/2003 | Marchl et al. |

FOREIGN PATENT DOCUMENTS

| AU | 23356/70 | 6/1972 |
| DE | 21 01 290 | 9/1971 |
| DE | 102 61 365 | 7/2004 |
| JP | 2004-179644 | 6/2004 |
| WO | 00/60381 | 10/2000 |
| WO | 2005/100016 | 10/2005 |

* cited by examiner

*Primary Examiner* — Ashok Patel
(74) *Attorney, Agent, or Firm* — Hamre, Schumann, Mueller & Larson, P.C.

(57) ABSTRACT

A light-emitting module (1) includes a substrate (10), a plurality of light-emitting elements (14) formed on the substrate (10), and phosphor layers (15) covering each of the light-emitting elements (14). Each of the phosphor layers (15) includes a first phosphor region (15a) and a second phosphor region (15b) that are divided in the direction substantially parallel to the surface of the substrate (10). Each of the first phosphor region (15a) and the second phosphor region (15b) includes a phosphor that absorbs light emitted from the light-emitting element (14) and emits fluorescence. The maximum peak wavelength of fluorescence emitted from the first phosphor region (15a) is longer than that of fluorescence emitted from the second phosphor region (15b).

22 Claims, 13 Drawing Sheets

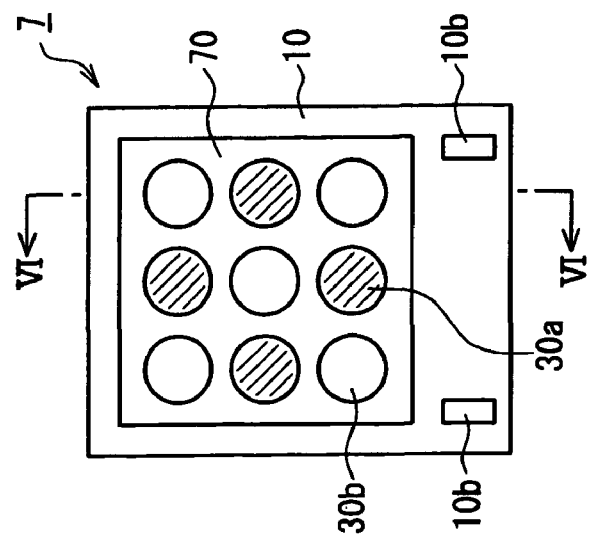
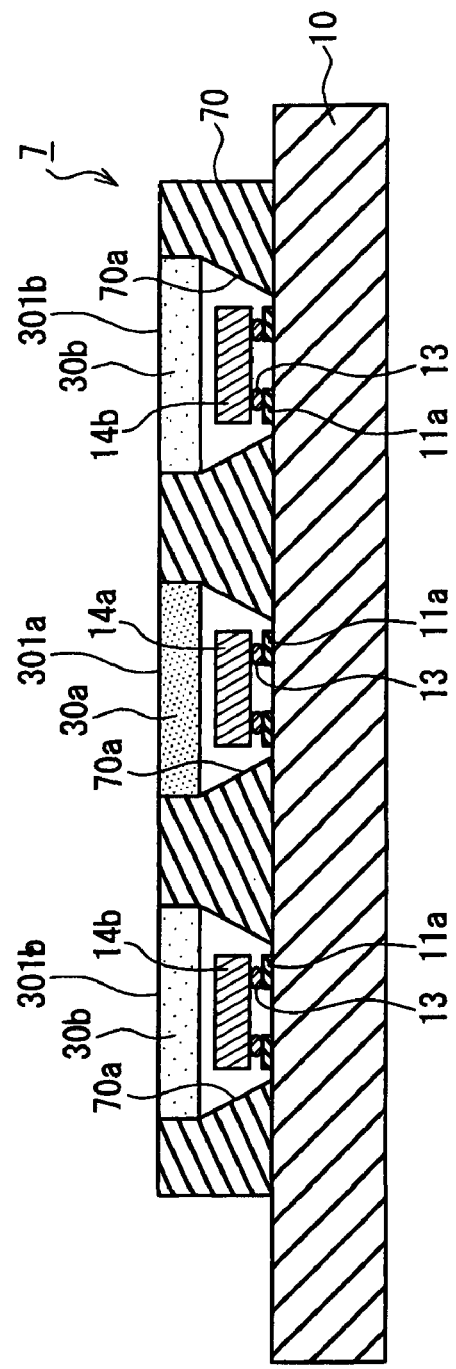
FIG. 12A
FIG. 12B

LIGHT-EMITTING MODULE, AND DISPLAY UNIT AND LIGHTING UNIT USING THE SAME

CROSS-REFERENCE TO RELATED APPLICATIONS

This application is a Continuation of application Ser. No. 11/995,290, filed Jan. 10, 2008, which is a U.S. National Stage of PCT/JP2006/322051, filed Oct. 27, 2006, which applications are incorporated herein by reference.

TECHNICAL FIELD

The present invention relates to a light-emitting module including a plurality of light-emitting elements, and a display unit and a lighting unit that use the light-emitting module.

BACKGROUND ART

A light-emitting diode (referred to as "LED" in the following) is known as a light-emitting element including a semiconductor multilayer film. In particular, when a LED for emitting blue light such as a GaN LED is combined with a phosphor that emits green light or red light by excitation of the blue light, the LED can be applied to a light-emitting device for emitting white light.

FIG. 13 is a cross-sectional view of a conventional light-emitting device that emits white light. As shown in FIG. 13, a light-emitting device 100 includes the following: a main substrate 101; a sub-mount substrate 102 mounted on the main substrate 101; a blue LED 104 mounted on a conductor pattern 103 that is provided on the sub-mount substrate 102; and a phosphor layer 105 formed on the sub-mount substrate 102 to cover the blue LED 104. The phosphor layer 105 includes a phosphor that absorbs blue light emitted from the blue LED 104 and emits fluorescence. As such a phosphor, e.g., a yellow phosphor for emitting yellow light, a green phosphor for emitting green light, or a red phosphor for emitting red light is dispersed. In particular, if the green phosphor and the red phosphor are used together, the color rendering of a luminescent color can be improved.

In the light-emitting device 100, however, when the green phosphor and the red phosphor are used together, the red phosphor is excited by not only the blue light emitted from the blue LED 104, but also the green light emitted from the green phosphor. Therefore, part of the green light emitted from the green phosphor may be quenched. To solve this problem, JP 2004-179644 A discloses a light-emitting device in which a green phosphor layer including a green phosphor is formed on a red phosphor layer including a red phosphor.

FIG. 14 is a cross-sectional view of the light-emitting device that has been proposed in 2004-179644 A. As shown in FIG. 14, a light-emitting device 200 includes a blue LED 202 that is mounted in a hollow 201a of a lead frame 201. Moreover, a red phosphor layer 203a covering the blue LED 202 and a green phosphor layer 203b formed on the red phosphor layer 203a are provided in the hollow 201a. The members except at the ends of the lead frame 201 are sealed with a sealing resin layer 204. With this configuration, the green light emitted from the green phosphor layer 203b to the sealing resin layer 204 (i.e., the green light traveling toward the light extraction side) is not absorbed by the red phosphor layer 203a. Accordingly, the configuration can solve at least the problem of quenching of the green component of light produced.

However, in the light-emitting device 200 of JP 2004-179644 A, the blue light emitted from the blue LED 202 or the red light emitted from the red phosphor layer 203a may be refracted or reflected when the light passes through the boundary between the red phosphor layer 203a and the green phosphor layer 203b. Thus, the blue and red components of light produced by the light-emitting device 200 may be reduced, resulting in low luminescence intensity.

DISCLOSURE OF INVENTION

With the foregoing in mind, the present invention provides a light-emitting module that can suppress a reduction in luminescence intensity, and a display unit and a lighting unit that use the light-emitting module.

A first light-emitting module of the present invention includes a substrate, a plurality of light-emitting elements formed on the substrate, and phosphor layers covering each of the light-emitting elements. Each of the phosphor layers includes a first phosphor region and a second phosphor region that are divided in the direction substantially parallel to the surface of the substrate. Each of the first phosphor region and the second phosphor region includes a phosphor that absorbs light emitted from the light-emitting element and emits fluorescence. The maximum peak wavelength of fluorescence emitted from the first phosphor region is longer than that of fluorescence emitted from the second phosphor region.

A second light-emitting module of the present invention includes a substrate, a plurality of light-emitting elements formed on the substrate, and phosphor layers covering each of the light-emitting elements. The light-emitting elements include first light-emitting elements and second light-emitting elements. The phosphor layers include first phosphor layers covering the first light-emitting elements and second phosphor layers covering the second light-emitting elements. Each of the first phosphor layers includes a phosphor that absorbs light emitted from the first light-emitting element and emits fluorescence. Each of the second phosphor layers includes a phosphor that absorbs light emitted from the second light-emitting element and emits fluorescence. The maximum peak wavelength of fluorescence emitted from the first phosphor layer is longer than that of fluorescence emitted from the second phosphor layer.

A display unit and a lighting unit of the present invention include the light-emitting module of the present invention as a light source.

BRIEF DESCRIPTION OF DRAWINGS

FIG. 12A is a top view showing a light-emitting module of Embodiment 7 of the present invention. FIG. 12B is a cross-sectional view taken along the line VI-VI in FIG. 12A.

DESCRIPTION OF THE INVENTION

Figure 1A:
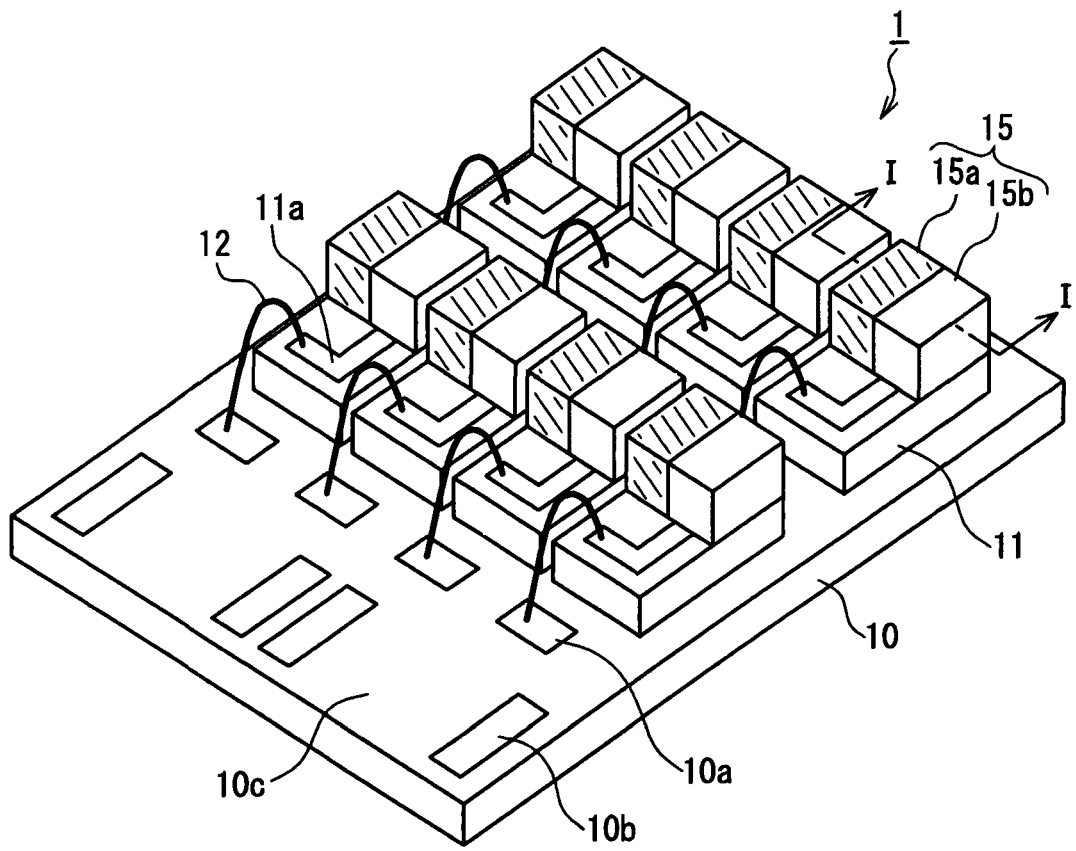
FIG. 1A is a perspective view showing a light-emitting module of Embodiment 1 of the present invention.

The first light-emitting module of the present invention includes a substrate, a plurality of light-emitting elements formed on the substrate, and phosphor layers covering each of the light-emitting elements.

The substrate includes, e.g., a base material and a conductive pattern formed on the base material. The base material is not particularly limited and may be, e.g., a ceramic material such as $Al_2O_3$ or AlN, a semiconductor material such as Si, or a laminated material in which an electrically insulating layer is formed on a metal layer. As the electrically insulating layer, e.g., a composite material including 50 to 95 mass % of inorganic filler and 5 to 50 mass % of thermosetting resin composition can be used. The thickness of the substrate is, e.g., about 0.1 to 1 mm.

The light-emitting element may be, e.g., an ultraviolet LED for emitting near-ultraviolet light or ultraviolet light with a wavelength of 410 nm or less, or a blue LED for emitting blue light with a wavelength of 440 to 490 nm. The material of the ultraviolet LED or blue LED is not particularly limited and can be, e.g., an InGaAlN material. The number of the light-emitting elements is not particularly limited and may be determined appropriately in accordance with the luminous energy required.

The light-emitting element may be mounted on the substrate either directly or via a sub-mount substrate. In particular, when the first light-emitting module of the present invention further includes a plurality of sub-mount substrates mounted on the substrate, one light-emitting element may be mounted on each of the sub-mount substrates. With this configuration, the light-emitting elements are mounted on the sub-mount substrates, and then the sub-mount substrates having the light-emitting elements are mounted on the substrate (main substrate). Therefore, the electrical or optical properties of the light-emitting elements can be inspected before they are mounted on the main substrates. Accordingly, only non-defective light-emitting elements can be selected and mounted on the main substrate. Thus, it is possible to avoid waste in the manufacturing process of the light-emitting module and improve yields. The material of the sub-mount substrate is not particularly limited, and the same materials as those for the main substrate can be used. The thickness of the sub-mount substrate is, e.g., 50 to 300 μm.

The phosphor layer includes the first phosphor region and the second phosphor region that are divided in the direction substantially parallel to the surface of the substrate. Each of the first phosphor region and the second phosphor region includes a phosphor that absorbs light emitted from the light-emitting element and emits fluorescence. The maximum peak wavelength of fluorescence emitted from the first phosphor region is longer than that of fluorescence emitted from the second phosphor region. In the first light-emitting module of the present invention, since the first phosphor region and the second phosphor region are divided in the direction substantially parallel to the surface of the substrate, there is no boundary of the phosphor layer that may interfere with the light traveling toward the light extraction side. This can suppress a reduction in luminescence intensity. The phosphor layer can be formed, e.g., by producing a phosphor paste in which a phosphor is dispersed in a dispersion material and applying the phosphor paste to the light-emitting elements. Examples of the dispersion material include a silicone resin, epoxy resin, fluorocarbon resin, olefin resin, and glass. Moreover, an inorganic filler such as silica or alumina may be dispersed in the phosphor paste to adjust the viscosity.

When the blue LED is used as the light-emitting element, the first phosphor region may include a phosphor (red phosphor) that emits red light having a maximum peak wavelength within the range of, e.g., 580 to 650 nm. In this case, the second phosphor region may include a phosphor (green phosphor) that emits green light having a maximum peak wavelength within the range of, e.g., 500 to 550 nm. The wavelength of blue light is closer to the green or red light than to the ultraviolet light. Therefore, using the blue LED as the light-emitting element while the first phosphor region and the second phosphor region include the red phosphor and the green phosphor, respectively, the Stokes loss can be reduced, thereby improving the luminous efficiency of the light-emitting module.

When the ultraviolet LED is used as the light-emitting element, the phosphor layer further may include a third phosphor region. In other words, the phosphor layer may include the first phosphor region, the second phosphor region, and the third phosphor region that are divided in the direction substantially parallel to the surface of the substrate. In this case, a phosphor included in the third phosphor region may be selected so that the maximum peak wavelength of fluorescence emitted from the third phosphor region is shorter than that of fluorescence emitted from the second phosphor region. For example, if the second phosphor region includes a green phosphor, the third phosphor region may include a phosphor (blue phosphor) that emits blue light having a maximum peak wavelength within the range of 450 to 490 nm.

The red phosphor may be, e.g., nitridosilicate $Sr_2Si_5N_8$:$Eu^{2+}$, nitridoaluminosilicate $CaAlSiN_3$:$Eu^{2+}$, oxo-nitridoaluminosilicate $Sr_2Si_4AlON_7$:$Eu^{2+}$, or LOS $La_2O_2S$:$Eu^{3+}$. The green phosphor may be, e.g., $BaMgAl_{10}O_{17}$:$Eu^{2+}$, $BaMgAl_{10}O_{17}$:$Mn^{2+}$, $SrAl_2O_4$:$Eu^{2+}$, or silicate $(Ba, Sr)_2SiO_4$:$Eu^{2+}$. The blue phosphor may be, e.g., $(Sr, Ca)_{10}(PO_4)_6Cl_2$:$Eu^{2+}$ or $BaMgAl_{10}O_{17}$:$Eu^{2+}$.

In the first light-emitting module of the present invention, the first phosphor regions and the second phosphor regions may be arranged alternately in each row and in each column with respect to the surface of the substrate. This can suppress nonuniform luminescent color.

Next, the second light-emitting module of the present invention will be described. The explanation that overlaps with that of the first light-emitting module may be omitted in the following.

The second light-emitting module of the present invention includes a substrate, a plurality of light-emitting elements formed on the substrate, and phosphor layers covering each of the light-emitting elements. The light-emitting elements include first light-emitting elements and second light-emitting elements.

As the first and second light-emitting elements, e.g., the blue LED can be used. Moreover, the first light-emitting element may be a green LED that emits green light with a wavelength of 500 to 550 nm. The green LED may be made of, e.g., a InGaAlN material.

The phosphor layers include first phosphor layers covering the first light-emitting elements and second phosphor layers covering the second light-emitting elements. Each of the first phosphor layers includes a phosphor that absorbs light emitted from the first light-emitting element and emits fluorescence. Each of the second phosphor layers includes a phosphor that absorbs light emitted from the second light-emitting element and emits fluorescence. The maximum peak wavelength of fluorescence emitted from the first phosphor layer is longer than that of fluorescence emitted from the second phosphor layer. In the second light-emitting module of the present invention, the first phosphor layer and the second phosphor layer are not stacked, but formed individually to cover the first light-emitting element or the second light-emitting element. Thus, there is no boundary of the phosphor layer that may interfere with the light traveling toward the light extraction side. This can suppress a reduction in luminescence intensity.

When the blue LED is used as the light-emitting element, the first phosphor layer may include, e.g., the above red phosphor. In this case, the second phosphor layer may include, e.g., the above green phosphor. The wavelength of blue light is closer to the green or red light than to the ultraviolet light. Therefore, using the blue LED as the light-emitting element while the first phosphor layer and the second phosphor layer include the red phosphor and the green phosphor, respectively, the Stokes loss can be reduced, thereby improving the luminous efficiency of the light-emitting module.

The second light-emitting module of the present invention further may include third light-emitting elements and third phosphor layers covering the third light-emitting elements. As the third light-emitting element, e.g., the ultraviolet LED can be used. In this case, a phosphor included in the third phosphor layer may be selected so that the maximum peak wavelength of fluorescence emitted from the third phosphor layer is shorter than that of fluorescence emitted from the second phosphor layer. For example, if the second phosphor layer includes a green phosphor, the third phosphor layer may include the above blue phosphor.

In the second light-emitting module of the present invention, the first phosphor layers and the second phosphor layers may be arranged alternately in each row and in each column with respect to the surface of the substrate. This can suppress nonuniform luminescent color.

Hereinafter, embodiments of the present invention will be described in detail. In the drawings, the components having substantially the same function are denoted by the same reference numerals, and the explanation will not be repeated.

Embodiment 1

Figure 1B:
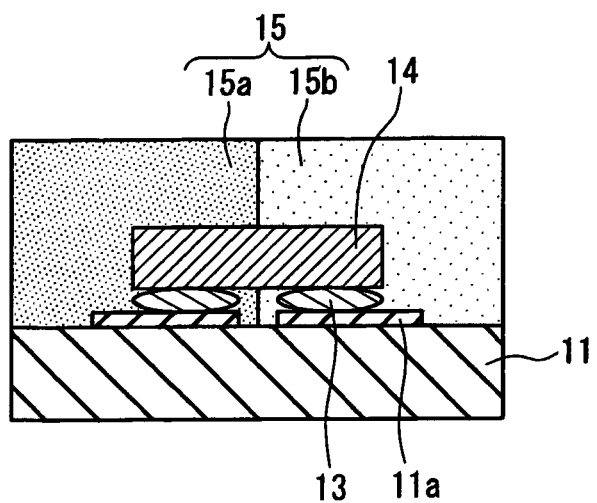
FIG. 1B is a cross-sectional view showing a phosphor layer and a sub-mount substrate, taken along the line I-I in FIG. 1A.

A light-emitting module of Embodiment 1 of the present invention will be described with reference to the drawings. FIG. 1A is a perspective view showing the light-emitting module of Embodiment 1. FIG. 1B is a cross-sectional view showing a phosphor layer and a sub-Mount substrate, taken along the line I-I in FIG. 1A.

As shown in FIG. 1A, a light-emitting module 1 includes a main substrate 10 and a plurality of sub-mount substrates 11 mounted on the main substrate 10. A conductive pattern 11a is formed on each of the sub-mount substrates 11 and connected electrically to an internal terminal 10a on the main substrate 10 via a wire 12. An external connection terminal 10b is provided at the end of the main substrate 10.

As shown in FIG. 1B, a light-emitting element 14 is mounted on each of the sub-mount substrates 11 via the conductive pattern 11a and a bump 13. A phosphor layer 15 is formed on the sub-mount substrate 11 to cover the light-emitting element 14. The light-emitting element 14 may be, e.g., a blue LED.

The phosphor layer 15 includes a first phosphor region 15a and a second phosphor region 15b that are divided in the direction substantially parallel to the principal surface 10c (see FIG. 1A) of the main substrate 10. Each of the first phosphor region 15a and the second phosphor region 15b includes a phosphor that absorbs light emitted from the light-emitting element 14 and emits fluorescence. The maximum peak wavelength of fluorescence emitted from the first phosphor region 15a is longer than that of fluorescence emitted from the second phosphor region 15b. In the light-emitting module 1, the first phosphor region 15a and the second phosphor region 15b are divided in the direction substantially parallel to the principal surface 10c of the main substrate 10. In other words, the boundary between the first phosphor region 15a and the second phosphor region 15b is arranged substantially perpendicular to the principal surface 10c of the main substrate 10. Thus, there is no boundary of the phosphor layer that may interfere with the light traveling toward the light extraction side. This can suppress a reduction in luminescence intensity. The first phosphor region 15a may include, e.g., a red phosphor. The second phosphor region 15b may include, e.g., a green phosphor.

Figure 1C:
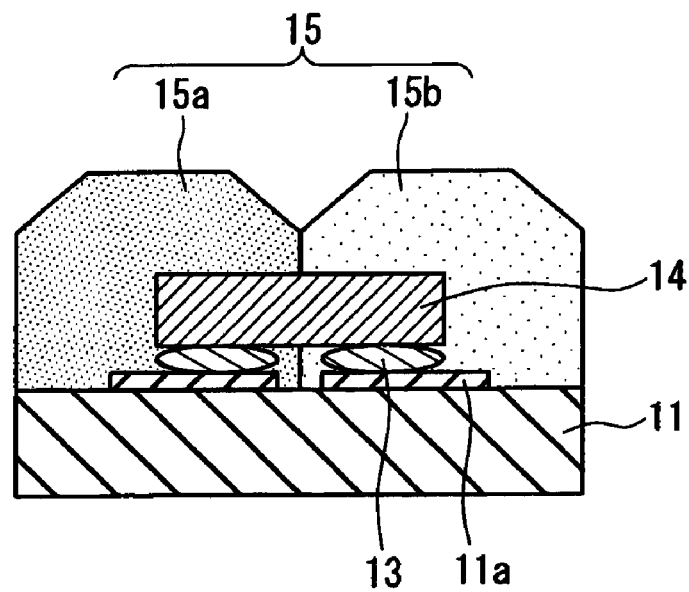
FIG. 1C is a cross-sectional view showing a modified example of the configuration in FIG. 1B.
Figure 2:
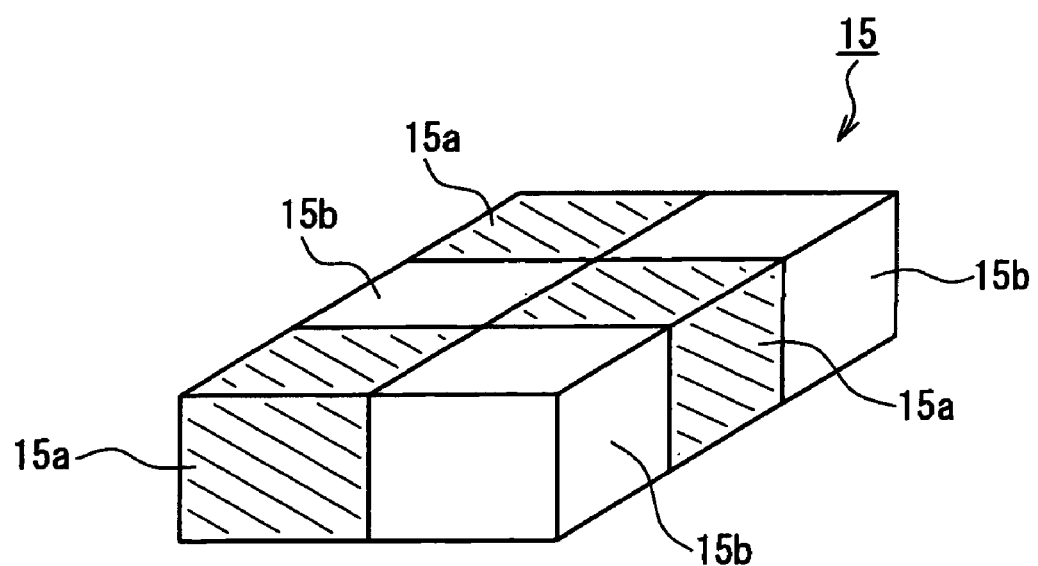
FIG. 2 is a perspective view showing an example of a phosphor layer used for a light-emitting module of the present invention.

The light-emitting module 1 of Embodiment 1 of the present invention has been described above, but the present invention is not limited thereto. For example, this embodiment allows the first phosphor region 15a and the second phosphor region 15b to be divided into equal parts. However, they do not have to be divided into equal parts, and the division ratio may be determined in accordance with the luminescent color required. In this embodiment, all the sub-mount substrates 11 are arranged in the same direction. However, the orientation of the sub-mount substrates 11 may be reversed every other column. With this configuration, light can be dispersed efficiently, so that nonuniform luminescent color can be suppressed. Moreover, the edges of the first phosphor regions 15a and the second phosphor regions 15b may be chamfered, as shown in FIG. 1C. With this configuration, both the distance from the light-emitting element 14 to the outer surface of the first phosphor region 15a and the distance from the light-emitting element 14 to the outer surface of the second phosphor region 15b can be made more uniform, so that nonuniform luminescent color can be suppressed. Further, the first phosphor regions 15a and the second phosphor regions 15b may be arranged alternately in each row and in each column, as shown in the perspective view of FIG. 2. This configuration can suppress the nonuniform luminescent color of light produced by the light-emitting module 1.

Next, a preferred method for forming the phosphor layer 15 of the light-emitting module 1 will be described below. FIGS. 3A to 3E are cross-sectional views of a process flow for explaining the method for forming the phosphor layer 15. In the method as shown in FIGS. 3A to 3E, the phosphor layer 15 is formed by ink jet printing.

Figure 3A:
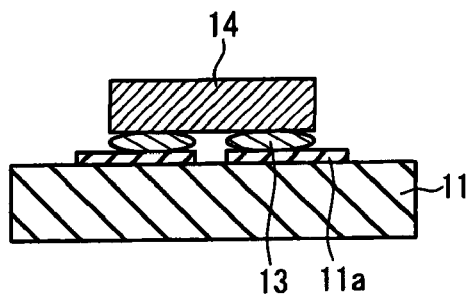
FIGS. 3A to 3E are cross-sectional views of a process flow for explaining a method for forming a phosphor layer included in a light-emitting module of Embodiment 1 of the present invention.
Figure 3B:
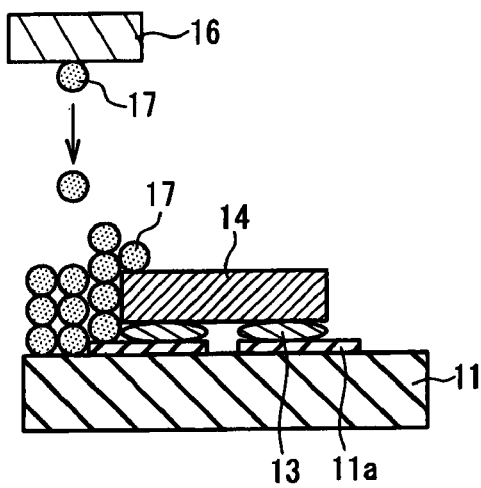
Figure 3C:
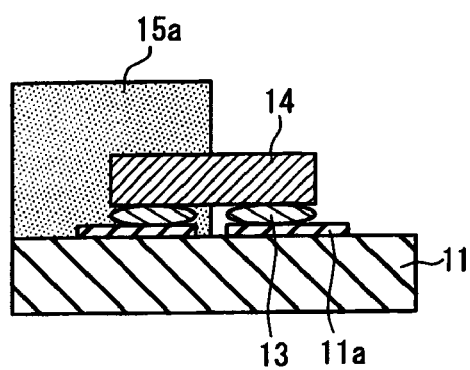

First, as shown in FIG. 3A, the sub-mount substrate 11 on which the light-emitting element 14 is mounted is prepared. Then, as shown in FIG. 3B, a red phosphor paste 17 containing a red phosphor is discharged from a first head 16 along the sides and the top of the light-emitting element 14. Thus, the first phosphor region 15a covering part of the light-emitting element 14 is formed, as shown in FIG. 3C.

Figure 3D:
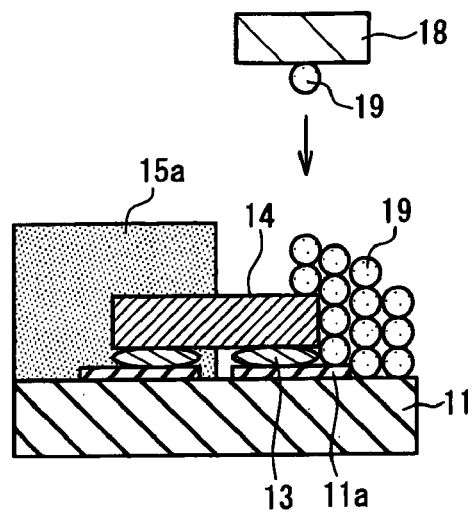
Figure 3E:
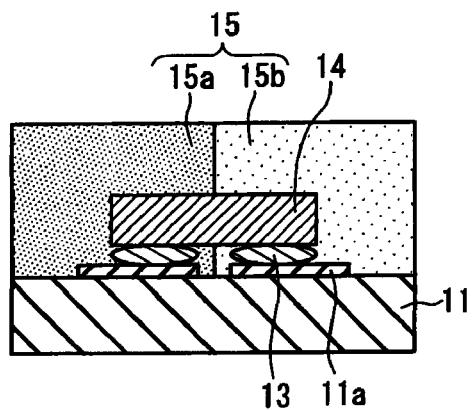

Subsequently, as shown in FIG. 3D, a green phosphor paste 19 containing a green phosphor is discharged from a second head 18 along the exposed sides and top of the light-emitting element 14. Thus, the second phosphor region 15b covering part of the light-emitting element 14 is formed, as shown in FIG. 3E. Consequently, the phosphor layer 15 including the first phosphor region 15a and the second phosphor region 15b is produced.

It is preferable that an ink jet technique is used as a method for forming the phosphor layer 15. This is because the technique can provide accuracy in the shape of the phosphor layer 15 to be formed. For example, 0.3 mm square, 0.6 mm square, or 1 mm square is known as the size of the light-emitting element 14. When the light-emitting element 14 with such a size is covered with the phosphor layer 15, the thickness of the phosphor layer 15 should be, e.g., about 20 to 2000 μm (preferably 20 to 200 μm). To form such a phosphor layer 15 accurately, the ink jet technique is considered suitable, since a small amount of phosphor paste is applied in such a manner that a block is piled up with each shot. The ink jet technique can make an array of dots of the phosphor paste having a diameter of 1 μm or less that are arranged precisely on the outer periphery and in the vicinity of the light-emitting element 14. Therefore, the phosphor layer with a small thickness (e.g., about 20 μm) can be formed accurately. As in the case of the phosphor layer 15 of this embodiment, when the first phosphor region 15a and the second phosphor region 15b are next to each other, and the boundary between them is provided precisely perpendicular to the sub-mount substrate 11, the ink jet technique also is considered suitable for the same reason as described above. The ink jet technique applies a small amount of phosphor paste in such a manner that a block is piled up with each shot, and thus allows the phosphor layer 15 to have various shapes. For example, the outer surface of the phosphor layer 15 can be made uneven by forming some projections in the form of a triangular pyramid or rectangular parallelepiped or line-shaped projections. This can improve the extraction efficiency of light passing through the phosphor layer 15. Moreover, it is possible not only to reduce the thickness of the phosphor layer 15, but also to suppress the thickness variations. Thus, nonuniform luminescent color can be suppressed.

The preferred method for forming the phosphor layer 15 of the light-emitting module 1 has been described above, but the formation of the phosphor layer 15 is not limited to the above method. For example, screen printing or potting also can be used.

Embodiment 2

Figure 4A:
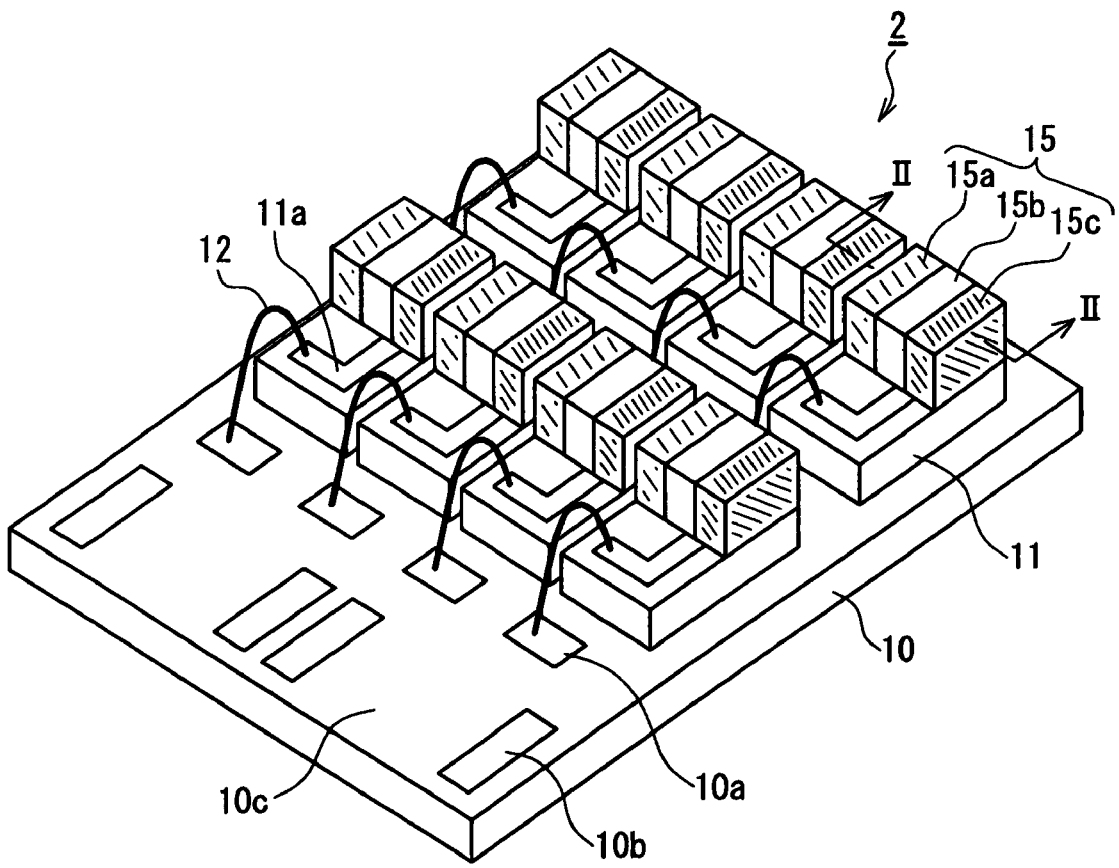
FIG. 4A is a perspective view showing a light-emitting module of Embodiment 2 of the present invention.
Figure 4B:
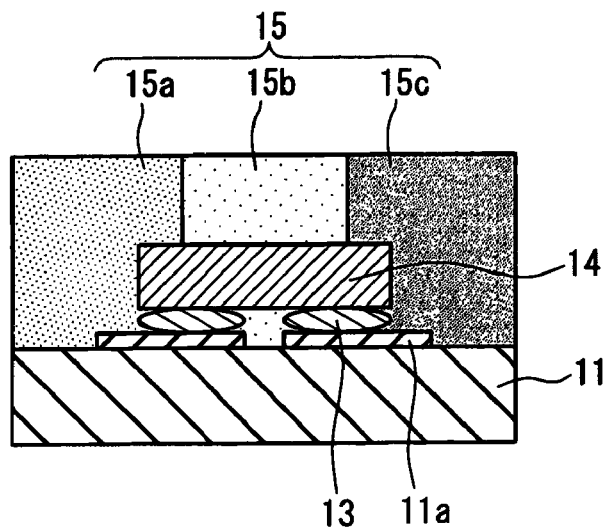
FIG. 4B is a cross-sectional view showing a phosphor layer and a sub-mount substrate, taken along the line in FIG. 4A.

A light-emitting module of Embodiment 2 of the present invention will be described with reference to the drawings. FIG. 4A is a perspective view showing the light-emitting module of Embodiment 2. FIG. 4B is a cross-sectional view showing a phosphor layer and a sub-mount substrate, taken along the line in FIG. 4A.

As shown in FIGS. 4A and 4B, in a light-emitting module 2, a phosphor layer 15 includes a first phosphor region 15a, a second phosphor region 15b, and a third phosphor region 15c that are divided in the direction substantially parallel to the principal surface 10c of the main substrate 10. The first phosphor region 15a and the second phosphor region 15b are the same as those of the light-emitting module 1 (see FIGS. 1A and 1B). The third phosphor region 15c may include a phosphor that emits fluorescence with a shorter wavelength than the phosphor in the second phosphor region 15b, such as a blue phosphor. The light-emitting element 14 of the light-emitting module 2 may be, e.g., a ultraviolet LED. The rest of the configuration is the same as that of the light-emitting module 1.

In the light-emitting module 2, since the first phosphor region 15a, the second phosphor region 15b, and the third phosphor region 15c are divided in the direction substantially parallel to the principal surface 10c of the main substrate 10, there is no boundary of the phosphor layer that may interfere with the light traveling toward the light extraction side. This can suppress a reduction in luminescence intensity. The phosphor layer 15 of the light-emitting module 2 can be formed in the same manner as shown in FIGS. 3A to 3E.

Figure 5:
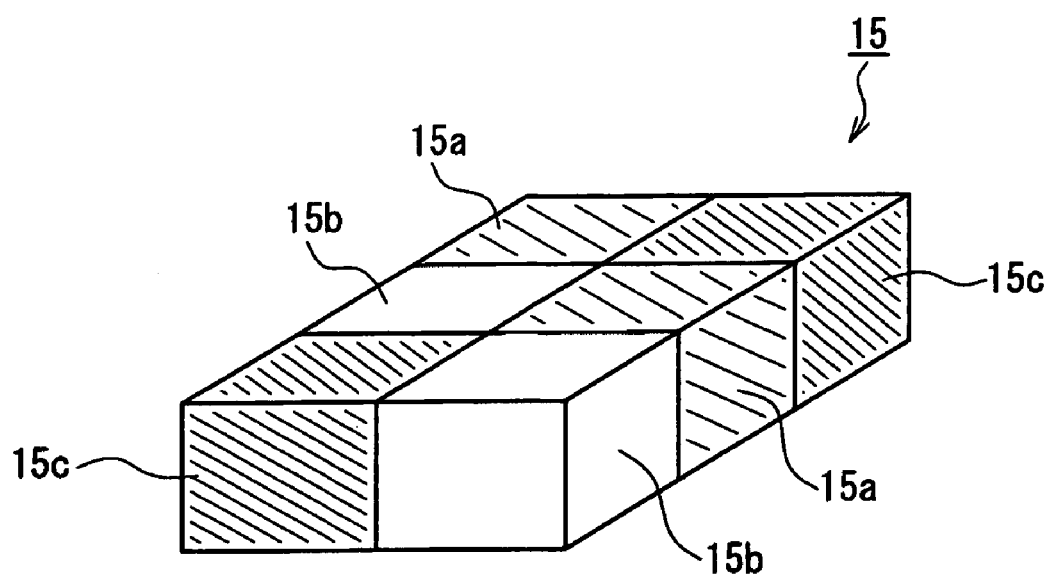
FIG. 5 is a perspective view showing an example of a phosphor layer used for a light-emitting module of the present invention.

The light-emitting module 2 of Embodiment 2 of the present invention has been described above, but the present invention is not limited thereto. For example, the first phosphor regions 15a, the second phosphor regions 15b, and the third phosphor region 15c may be arranged alternately in each row and in each column, as shown in the perspective view of FIG. 5. This configuration can suppress the nonuniform luminescent color of light produced by the light-emitting module 2.

Embodiment 3

Figure 6A:
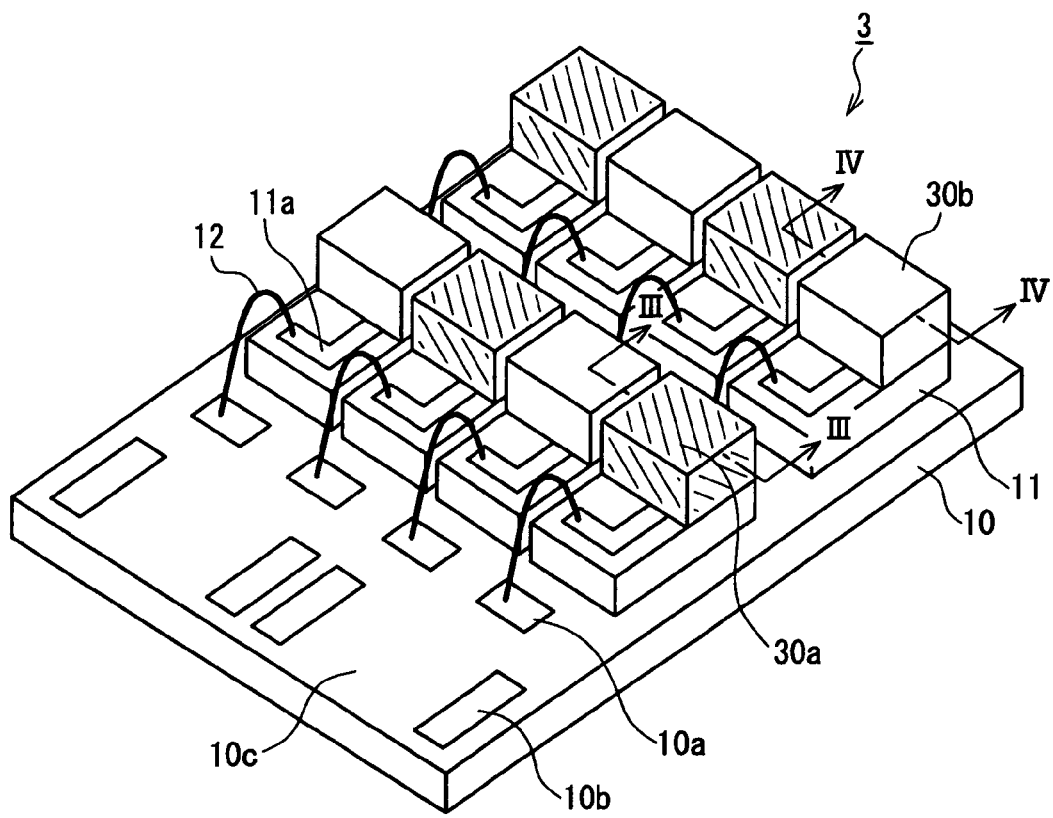
FIG. 6A is a perspective view showing a light-emitting module of Embodiment 3 of the present invention.
Figure 6B:
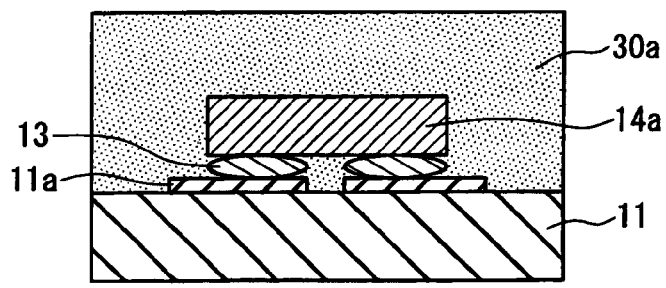
FIG. 6B is a cross-sectional view showing a phosphor layer and a sub-mount substrate, taken along the line III-III in FIG. 6A.
Figure 6C:
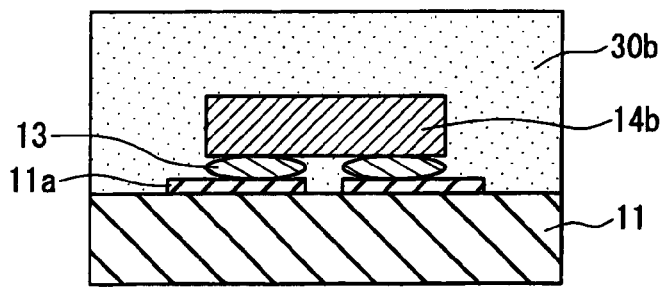
FIG. 6C is a cross-sectional view showing a phosphor layer and a sub-mount substrate, taken along the line IV-IV in FIG. 6A.

A light-emitting module of Embodiment 3 of the present invention will be described with reference to the drawings. FIG. 6A is a perspective view showing the light-emitting module of Embodiment 3. FIG. 6B is a cross-sectional view showing a phosphor layer and a sub-mount substrate, taken along the line III-III in FIG. 6A. FIG. 6C is a cross-sectional view showing a phosphor layer and a sub-mount substrate, taken along the line IV-IV in FIG. 6A.

A light-emitting module 3 includes a first light-emitting element 14a (see FIG. 6B) and a second light-emitting element 14b (see FIG. 6C). As shown in FIG. 6B, the first light-emitting element 14a is covered with a first phosphor layer 30a. As shown in FIG. 6C, the second light-emitting element 14b is covered with a second phosphor layer 30b. The first phosphor layer 30a includes a phosphor that absorbs light emitted from the first light-emitting element 14a and emits fluorescence. The second phosphor layer 30b includes a phosphor that absorbs light emitted from the second light-emitting element 14b and emits fluorescence. The maximum peak wavelength of fluorescence emitted from the first phosphor layer 30a is longer than that of fluorescence emitted from the second phosphor layer 30b. The rest of the configuration is the same as that of the first light-emitting module 1 (see FIGS. 1A and 1B). In the light-emitting module 3, the first phosphor layer 30a and the second phosphor layer 30b are not stacked, but formed individually to cover the first light-emitting element 14a or the second light-emitting element 14b. Thus, there is no boundary of the phosphor layer that may interfere with the light traveling toward the light extraction side. This can suppress a reduction in luminescence intensity. The first light-emitting element 14a and the second light-emitting element 14b may be, e.g., a blue LED. The first phosphor layer 30a may include, e.g., a red phosphor. The second phosphor layer 30b may include, e.g., a green phosphor.

As shown in FIG. 6A, the first phosphor layers 30a and the second phosphor layers 30b may be arranged alternately in each row and in each column with respect to the principal surface 10c of the main substrate 10. This configuration can suppress the nonuniform luminescent color of light produced by the light-emitting module 3.

The light-emitting module 3 of Embodiment 3 of the present invention has been described above, but the present invention is not limited thereto. For example, this embodiment allows the number of the first phosphor layers 30a to be the same as that of the second phosphor layers 30b. However, they do not have to be equal numbers, and the respective numbers of the first and second phosphor layers may be determined in accordance with the luminescent color required. Moreover, a light reflecting member may be formed around the first phosphor layer 30a and the second phosphor layer 30b. This can improve the light extraction efficiency of the light-emitting module 3.

Figure 7A:
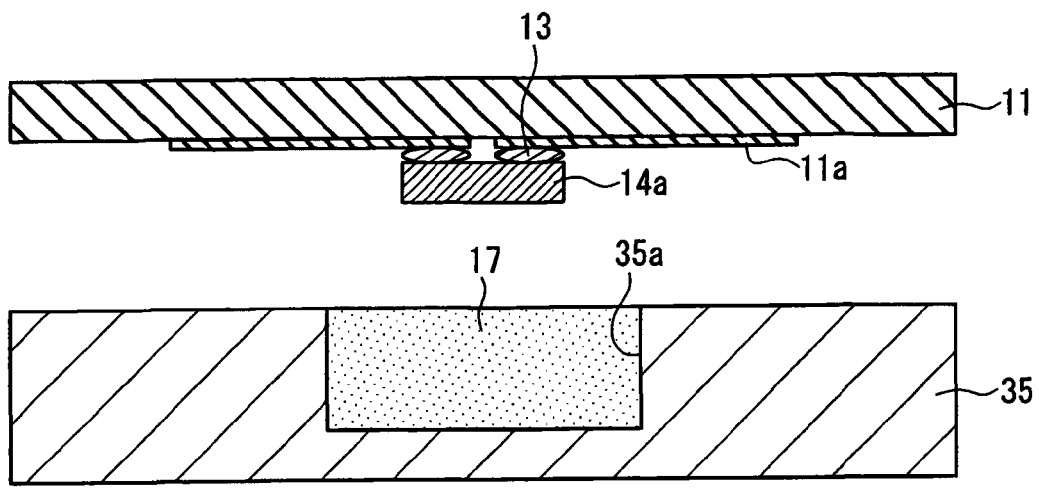
FIGS. 7A to 7C are cross-sectional views of a process flow for explaining a method for forming a phosphor layer included in a light-emitting module of Embodiment 3 of the present invention.
Figure 7B:
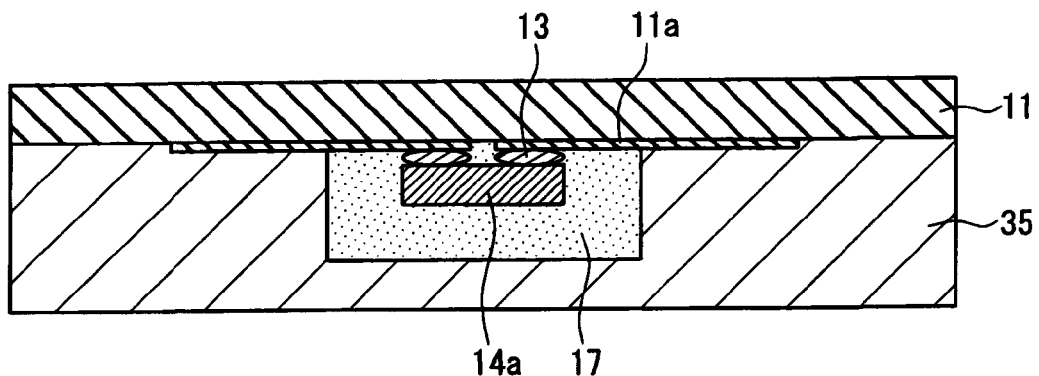
Figure 7C:
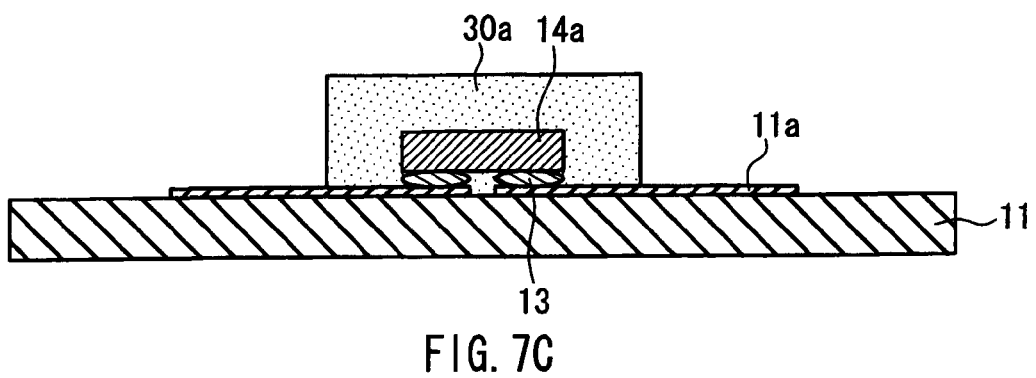

Next, a preferred method for forming the phosphor layer of the light-emitting module 3 will be described below by referring to the first phosphor layer 30a. FIGS. 7A to 7C are cross-sectional views of a process flow for explaining the method for forming the first phosphor layer 30a.

First, as shown in FIG. 7A, the sub-mount substrate 11 on which the first light-emitting element 14a is mounted, and a mold 35 filled with a red phosphor paste 17 are prepared. The red phosphor paste 17 can be filled into a hollow 35a of the mold 35, e.g., by screen printing or potting. The mold 35 may be made of metal such as iron.

Subsequently, as shown in FIG. 7B, the sub-mount substrate 11 provided with the first light-emitting element 14a and the mold 35 filled with the red phosphor paste 17 are laminated together so that the first light-emitting element 14a is embedded in the red phosphor paste 17. In this state, the mold 35 is heated to about 100 to 150° C. to harden the red phosphor paste 17. Then, the mold 35 is removed, and the first phosphor layer 30a covering the first light-emitting element 14a is produced, as shown in FIG. 7C.

The preferred method for forming the phosphor layer of the light-emitting module 3 has been described above, but the formation of the phosphor layer is not limited to the above method. For example, screen printing or potting also can be used to form the phosphor layer directly on the light-emitting element.

Next, an example of the light-emitting module 3 will be described below. A nitridoaluminosilicate red phosphor and a silicate green phosphor were used in the first phosphor layer 30a and the second phosphor layer 30b, respectively. A light-emitting module was produced by forming the first phosphor layer 30a and the second phosphor layer 30b with the method as shown in FIGS. 7A to 7C. A GaN LED having a maximum peak wavelength of 460 nm was used as the first light-emitting element 14a and the second light-emitting element 14b. As a comparative example, a light-emitting module was produced in the same manner as the above light-emitting module, except that the phosphor layer was formed by using a phosphor paste in which both the nitridoaluminosilicate red phosphor and the silicate green phosphor were dispersed in a dispersion material. The total luminous flux of each of the light-emitting modules of the example and the comparative example was measured using an integrating sphere. The results showed that the luminescence intensity of the light-emitting module of the example was 1.2 times as high as that of the light-emitting module of the comparative example.

Embodiment 4

Figure 8:
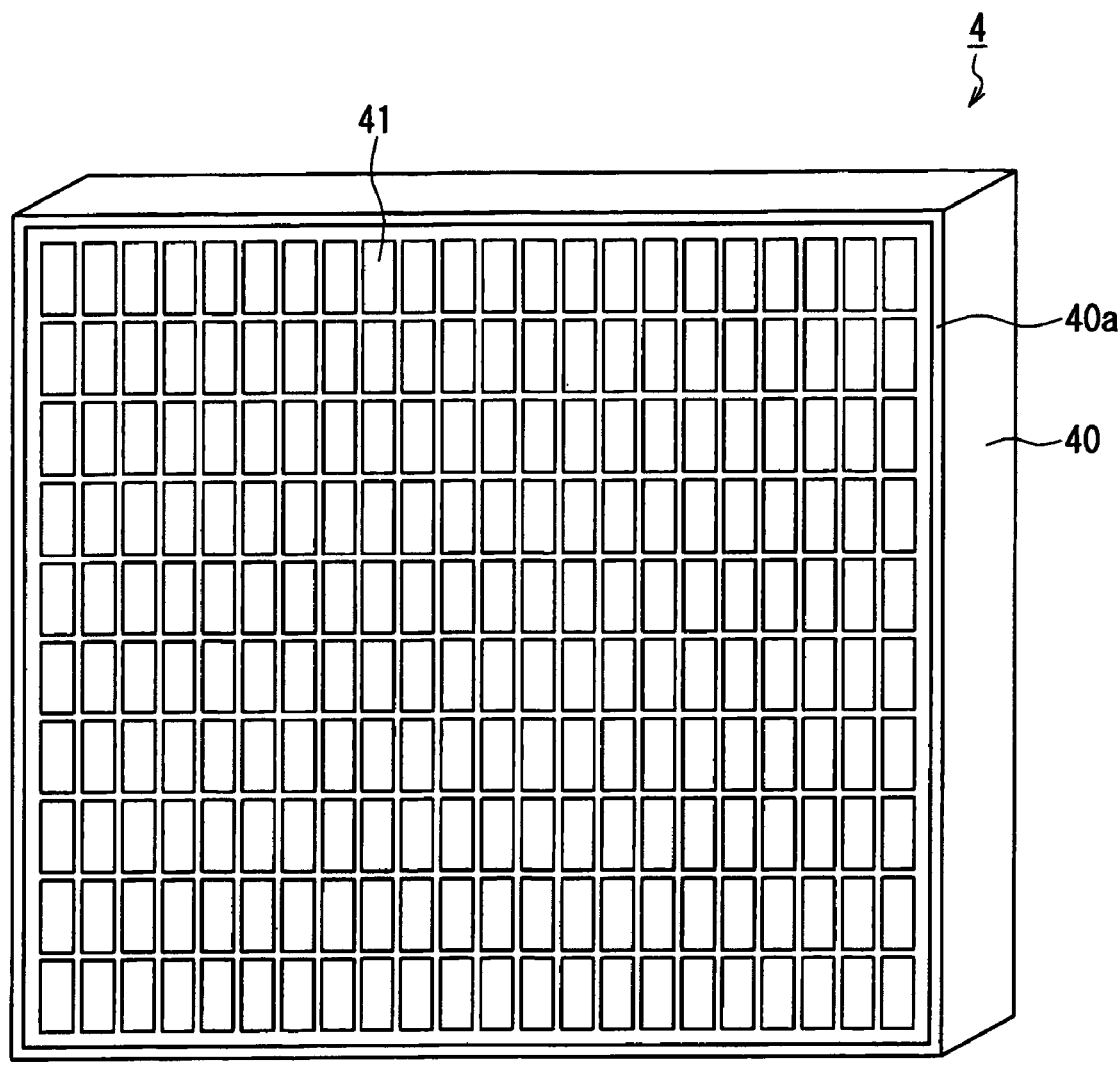
FIG. 8 is a perspective view showing a display unit (image display apparatus) of Embodiment 4 of the present invention.

A display unit (image display apparatus) of Embodiment 4 of the present invention will be described by referring to the drawings. FIG. 8 is a perspective view showing the image display apparatus of Embodiment 4.

As shown in FIG. 8, the image display apparatus 4 includes a panel 40. A plurality of light-emitting modules 41 according to any one of Embodiments 1 to 3 are arranged in a matrix form on a principal surface 40a of the panel 40 as light sources. The image display apparatus 4 with this configuration uses the light-emitting modules 41 according to any one of Embodiments 1 to 3 as light sources and thus can suppress a reduction in luminescence intensity.

Embodiment 5

Figure 9:
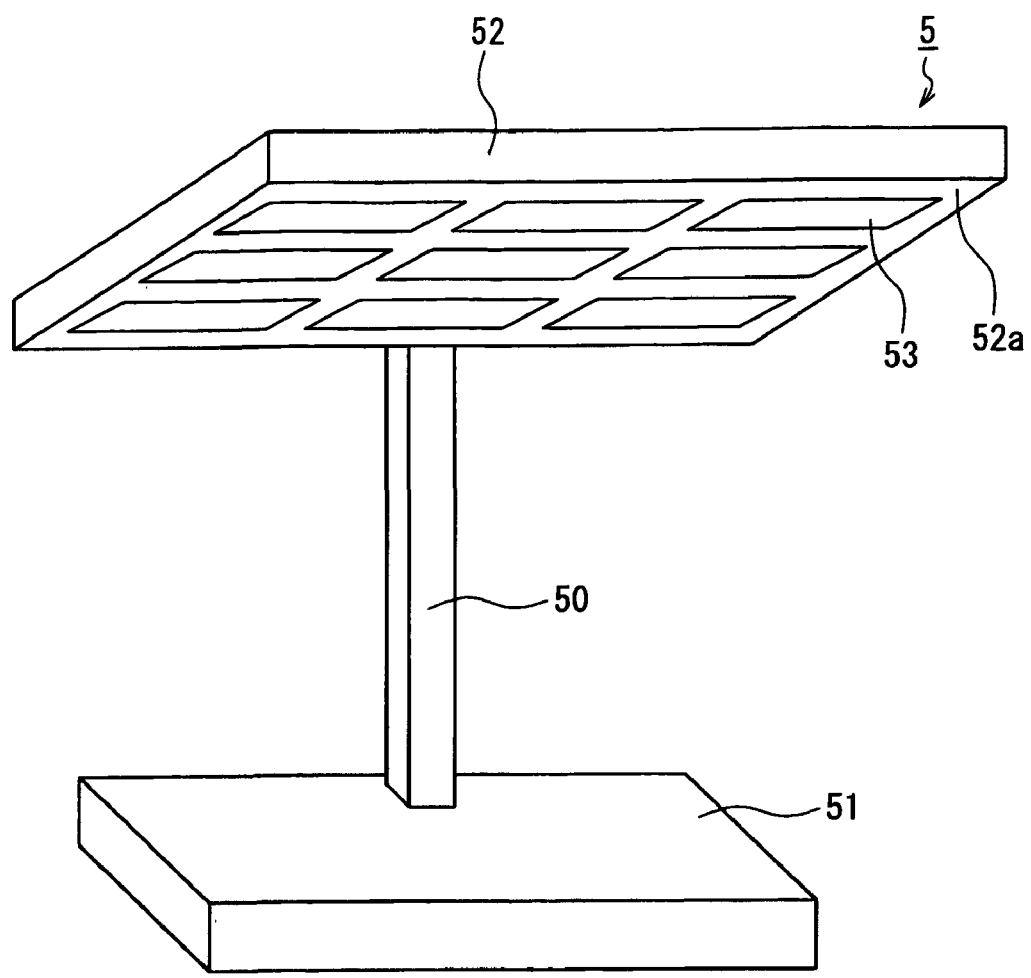
FIG. 9 is a perspective view showing a lighting unit (desktop lamp) of Embodiment 5 of the present invention.

A lighting unit (desktop lamp) of Embodiment 5 of the present invention will be described by referring to the drawings. FIG. 9 is a perspective view showing the desktop lamp of Embodiment 5.

As shown in FIG. 9, the desktop lamp 5 includes a neck 50, a base 51 that is fixed at one end of the neck 50 for supporting the neck 50, and a lighting portion 52 that is fixed at the other end of the neck 50. A plurality of light-emitting modules 53 according to any one of Embodiments 1 to 3 are arranged in a matrix form on a principal surface 52a of the lighting portion 52 as light sources. The desktop lamp 5 with this configuration uses the light-emitting modules 53 according to any one of Embodiments 1 to 3 as light sources and thus can suppress a reduction in luminescence intensity.

Embodiment 6

Figure 10A:
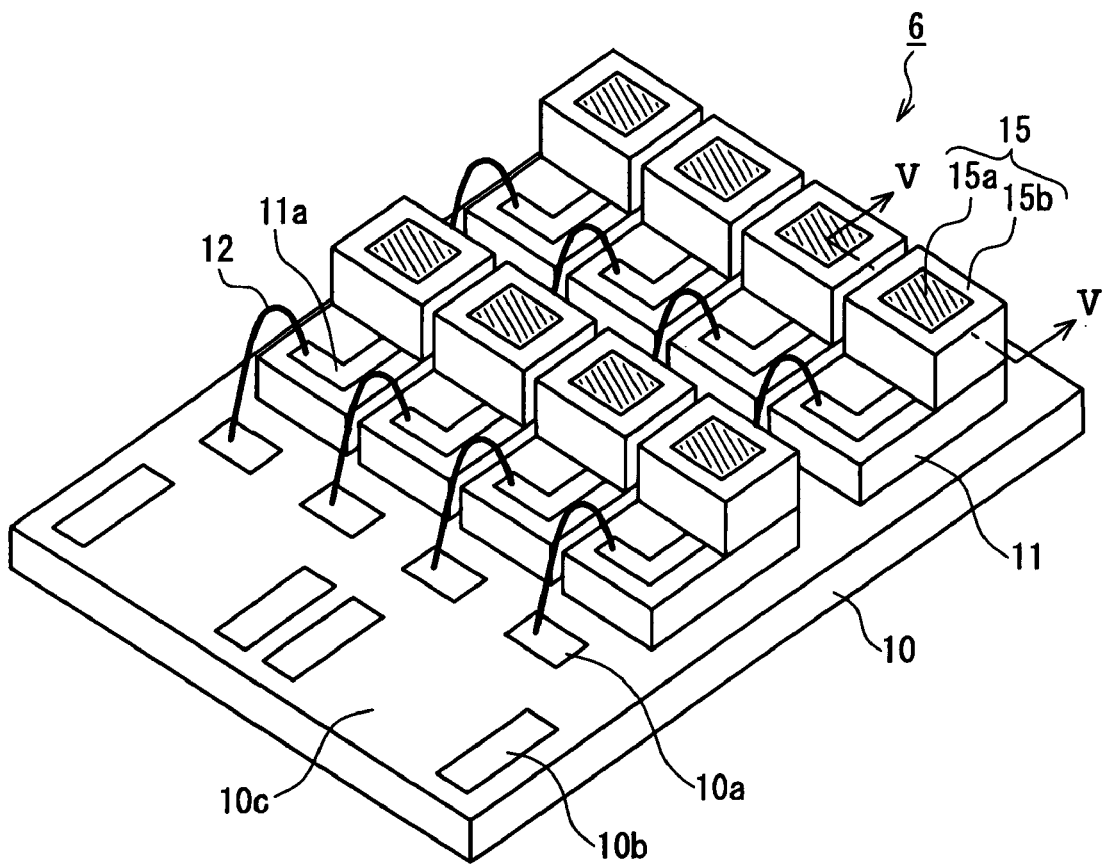
FIG. 10A is a perspective view showing a light-emitting module of Embodiment 6 of the present invention.
Figure 10B:
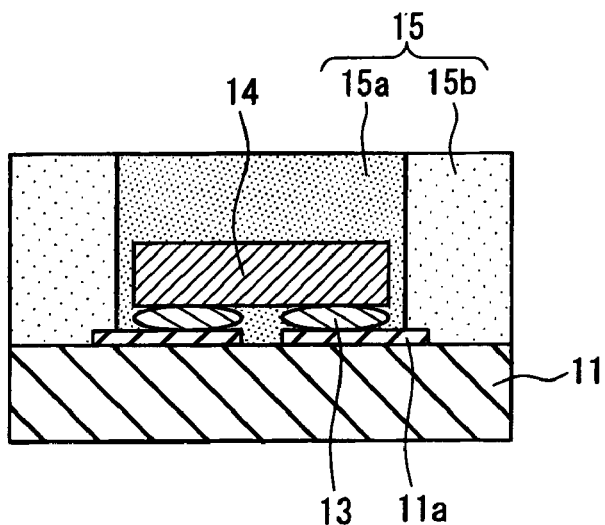
FIG. 10B is a cross-sectional view showing a phosphor layer and a sub-mount substrate, taken along the line V-V in FIG. 10A.

A light-emitting module of Embodiment 6 of the present invention will be described with reference to the drawings. FIG. 10A is a perspective view showing the light-emitting module of Embodiment 6. FIG. 10B is a cross-sectional view showing a phosphor layer and a sub-mount substrate, taken along the line V-V in FIG. 10A.

Figure 11:
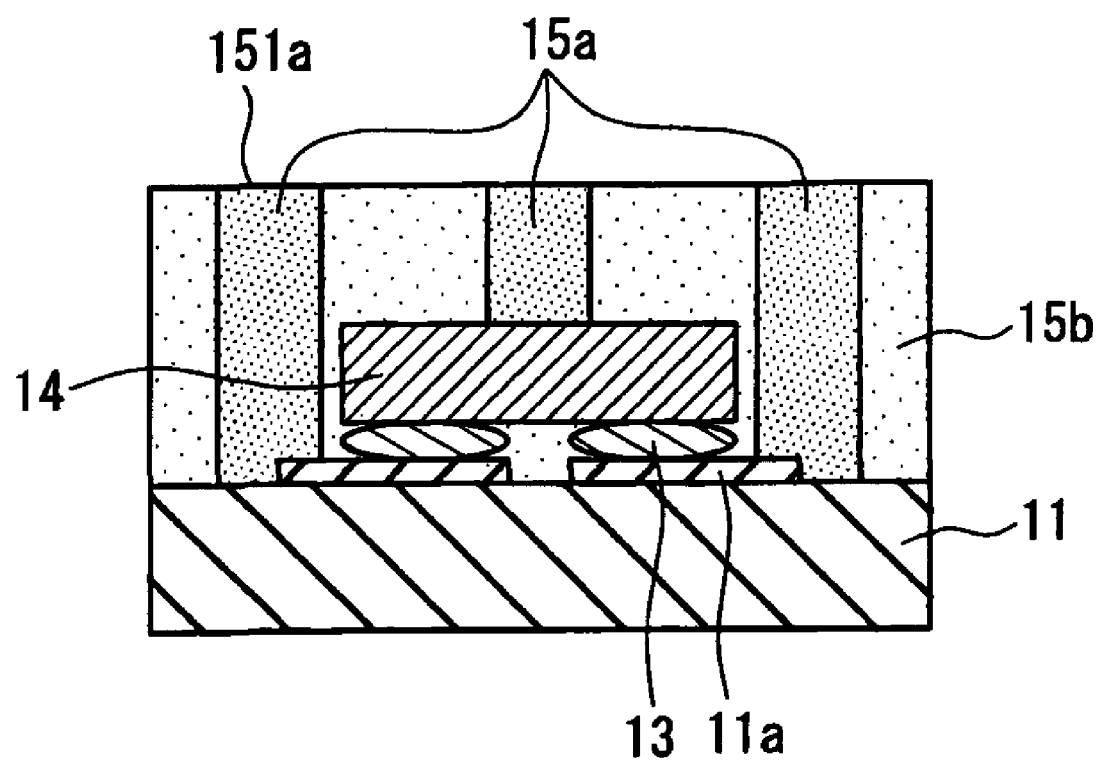
FIG. 11 is a cross-sectional view showing a modified example of the configuration in FIG. 10B.
Figure 13:
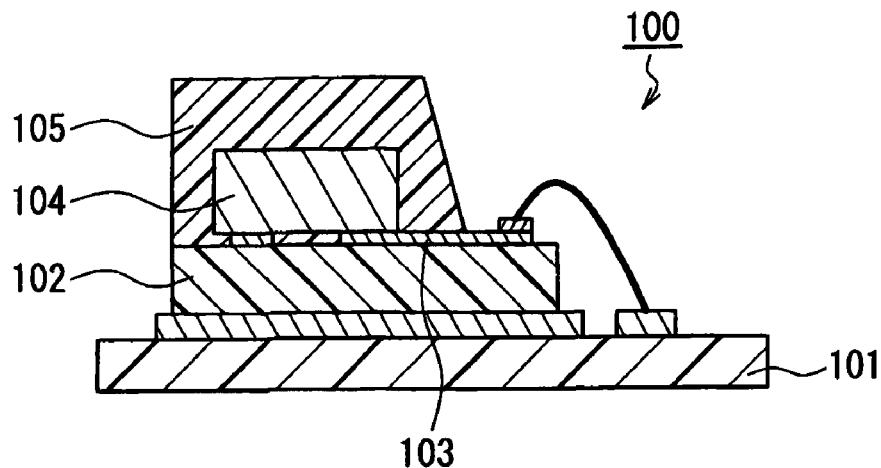
FIG. 13 is a cross-sectional view showing a conventional light-emitting device.
Figure 14:
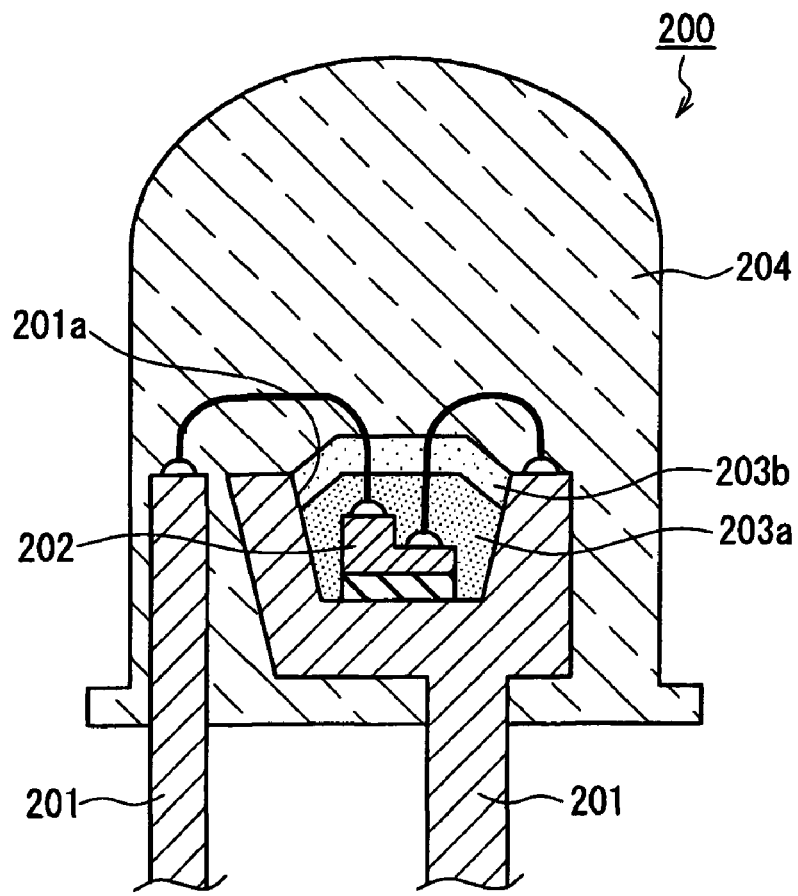
FIG. 14 is a cross-sectional view showing a conventional light-emitting device.

As shown in FIGS. 10A and 10B, a light-emitting module 6 differs from the light-emitting module 1 of Embodiment 1 (see FIGS. 1A and 1B) in arrangement of the first phosphor region 15a and the second phosphor region 15b. In the light-emitting module 6, the phosphor layer 15 includes the first phosphor region 15a and the second phosphor region 15b that are divided in the direction substantially parallel to the principal surface 10c of the main substrate 10. The second phosphor region 15b is arranged so as to surround the sides of the first phosphor region 15a. The rest of the configuration is the same as that of the light-emitting element 1. In the light-emitting module 6, since the boundary between the first phosphor region 15a and the second phosphor region 15b is substantially perpendicular to the principal surface 10c of the main substrate 10, a similar effect to that of the light-emitting module 1 can be obtained. This embodiment is not limited thereto, and a plurality of first phosphor regions 15a may be provided for one light-emitting element 14, as shown in FIG. 11. With this configuration, the first phosphor region 15a is subdivided, thereby suppressing the nonuniform luminescent color of light produced. In such a case, the exposed surface 151a of the first phosphor region 15a may protrude, so that the outer surface of the phosphor layer 15 from which light is extracted can be made uneven. This can improve the extraction efficiency of light passing through the phosphor layer 15. The shape of the first phosphor region 15a is not particularly limited and may be, e.g., a polygonal prism other than a rectangular prism or a cylinder.

Embodiment 7

A light-emitting module of Embodiment 7 of the present invention will be described with reference to the drawings. FIG. 12A is a top view of the light-emitting module of Embodiment 7. FIG. 12B is a cross-sectional view taken along the line VI-VI in FIG. 12A.

As shown in FIGS. 12A and 12B, a light-emitting module 7 further includes a reflecting plate 70 formed on the main substrate 10 in addition to the configuration of the light-emitting module 3 of Embodiment 3 (see FIGS. 6A to 6C). The reflecting plate 70 is made of, e.g., a high reflection material such as metal or ceramic. In the light-emitting module 7, the first light-emitting element 14a or the second light-emitting element 14b is placed in each of hollows 70a of the reflecting plate 70. As shown in FIG. 12B, the opening of the hollow 70a containing the first light-emitting element 14a is covered with the first phosphor layer 30a, and the opening of the hollow 70a containing the second light-emitting element 14b is covered with the second phosphor layer 30b. The space between the first light-emitting element 14a and the first phosphor layer 30a and the space between the second light-emitting element 14b and the second phosphor layer 30b are filled with an inert gas such as argon or a transparent resin such as a silicon resin. The rest of the configuration is the same as that of the light-emitting module 3. The light-emitting module 7 can have a similar effect to that of the light-emitting module 3, and further can improve the light extraction efficiency due to the presence of the reflecting plate 70. Moreover, since the light-emitting element does not come into contact with the phosphor layer, it is possible to suppress the degradation of the phosphor layer by heat generated from the light-emitting element. The light extraction surface 301a of the first phosphor layer 30a and the light extraction surface 301b and the second phosphor layer 30b may be made uneven. This can improve the extraction efficiency of light passing through the first phosphor layer 30a and the second phosphor layer 30b.

INDUSTRIAL APPLICABILITY

A light-emitting module of the present invention is suitable for a lighting unit used, e.g., in general lighting applications, lighting for presentation purposes (such as a sign light), or vehicle lighting (particularly a headlight) or a display unit used, e.g., in outdoor large display screens or projectors.

The invention claimed is:

1. A light-emitting module comprising:
a substrate;
a sub-mount substrate mounted on the substrate
a light-emitting element formed on the sub-mount substrate; and
a phosphor layer covering the light-emitting element,
wherein the phosphor layer comprises a first phosphor region and a second phosphor region that are divided in a direction substantially parallel to a surface of the substrate,
the second phosphor region is arranged so as to surround sides of the first phosphor region,
a boundary between the first phosphor region and the second phosphor region is substantially perpendicular to a principal surface of the substrate, and
at least a part of the first phosphor region is arranged on the light-emitting element.

2. The light-emitting module according to claim 1, wherein the first phosphor region is arranged so as to cover the light-emitting element entirely, and
the second phosphor region is arranged so as not to cover the light-emitting element.

3. The light-emitting module according to claim 1, wherein the phosphor layer comprises a plurality of the first phosphor regions and the second phosphor regions,
the second phosphor regions are arranged between the first phosphor regions, and
at least one of the first phosphor regions is arranged on the light-emitting element.

4. The light-emitting module according to claim 1, wherein an exposed surface of the first phosphor region is protruded.

5. The light-emitting module according to claim 1, wherein the first phosphor region has a rectangular prism shape.

6. The light-emitting module according to claim 1, wherein the first phosphor region has a cylinder shape.

7. The light-emitting module according to claim 1, wherein a maximum peak wavelength of fluorescence emitted from the first phosphor region is longer than that of fluorescence emitted from the second phosphor region.

8. The light-emitting module according to claim 1, wherein fluorescence emitted from the first phosphor region is red light having a maximum peak wavelength within a range of 590 to 650 nm, and
fluorescence emitted from the second phosphor region is green light having a maximum peak wavelength within a range of 500 to 550 nm.

9. The light-emitting module according to claim 1, wherein the light-emitting module comprises a plurality of the sub-mount substrates and the light-emitting elements, and
one light-emitting element is mounted on each of the sub-mount substrates.

10. A display device comprising the light-emitting module according to claim 1.

11. A lighting unit comprising the light-emitting module according to claim 1.

12. A light-emitting module comprising:
a substrate;
a light-emitting element formed on the substrate; and
a phosphor layer covering the light-emitting element,
wherein the phosphor layer comprises a first phosphor region and a second phosphor region that are divided in a direction substantially parallel to a surface of the substrate,
the second phosphor region is arranged so as to surround sides of the first phosphor region,
a boundary between the first phosphor region and the second phosphor region is substantially perpendicular to a principal surface of the substrate, and
at least a part of the first phosphor region is arranged on the light-emitting element.

13. The light-emitting module according to claim 12, wherein an exposed surface of the first phosphor region is protruded.

14. The light-emitting module according to claim 12, wherein the first phosphor region has a rectangular prism shape.

15. The light-emitting module according to claim 12, wherein the first phosphor region has a cylinder shape.

16. The light-emitting module according to claim 12, wherein a maximum peak wavelength of fluorescence emitted from the first phosphor region is longer than that of fluorescence emitted from the second phosphor region.

17. The light-emitting module according to claim 12, wherein fluorescence emitted from the first phosphor region is red light having a maximum peak wavelength within a range of 590 to 650 nm, and fluorescence emitted from the second phosphor region is green light having a maximum peak wavelength within a range of 500 to 550 nm.

18. The light-emitting module according to claim 12, wherein the light-emitting module comprises a plurality of the light-emitting elements.

19. A display device comprising the light-emitting module according to claim 12.

20. A lighting unit comprising the light-emitting module according to claim 12.

21. The light-emitting module according to claim 12, wherein the first phosphor region is arranged so as to cover the light-emitting element entirely, and the second phosphor region is arranged so as not to cover the light-emitting element.

22. The light-emitting module according to claim 12, wherein the phosphor layer comprises a plurality of the first phosphor regions and the second phosphor regions, the second phosphor regions are arranged between the first phosphor regions, and at least one of the first phosphor regions is arranged on the light-emitting element.

* * * * *